United States Patent [19]

Sekiguchi

[11] 4,103,290
[45] Jul. 25, 1978

[54] DIGITAL FREQUENCY DISPLAY DEVICE

[75] Inventor: Tadao Sekiguchi, Tokyo, Japan

[73] Assignee: Trio Kabushiki Kaisha, Tokyo, Japan

[21] Appl. No.: 767,830

[22] Filed: Feb. 11, 1977

[30] Foreign Application Priority Data

| Feb. 14, 1976 | [JP] | Japan | 51-15115 |
| Feb. 14, 1976 | [JP] | Japan | 51-15116 |
| Mar. 18, 1976 | [JP] | Japan | 51-29606 |

[51] Int. Cl.² .............. G06F 3/14; G08B 5/36; G08B 23/00
[52] U.S. Cl. .............. 340/168 B; 324/78 D; 340/324 R
[58] Field of Search ............ 340/168 R, 168 B, 168 S, 340/324 R; 324/78 D, 79 D

[56] References Cited

U.S. PATENT DOCUMENTS

| 3,749,896 | 7/1973 | Munt | 340/324 R |
| 3,764,984 | 10/1973 | McCartney | 340/168 S |
| 3,885,218 | 5/1975 | Pfab | 324/78 D |
| 3,925,777 | 12/1975 | Clark | 340/324 R |

Primary Examiner—Donald J. Yusko
Attorney, Agent, or Firm—Lane, Aitken, Dunner and Ziems

[57] ABSTRACT

A digital frequency display device includes a counter for counting a frequency to be displayed, a latch circuit for temporarily storing a plurality of digit signals from the counter and for outputting the digit signals in response to the latch pulses, a decoder for decoding the digit signals from the latch circuit into another coding system, a display section for visually displaying the digit signals decoded from the decoder, a gate for preventing the latch pulses from reaching the latch circuit at undesired times and a digit eraser for erasing any one of the digits of the numerals representing the frequency displayed when the latch pulses feeding to the latch circuit is blocked by the gate means.

11 Claims, 8 Drawing Figures

DIGITAL FREQUENCY DISPLAY DEVICE

BACKGROUND OF THE INVENTION

The present invention relates to a digital frequency display device for communication apparatuses such as receivers or transmitters.

Recently, communication apparatuses such as transceivers have frequently used a digital frequency display device for visually displaying the operating frequency.

The present invention proposes several improvements over the conventional display device of this type. The first is an addition of a new display function so that, during receiving or transmitting operation, a specified display frequency is memorised and other frequency bands or frequencies may be searched or two frequencies may be alternately observed for experiments, with the indication of the fact that the specified display frequency is memorised. The second improvement is the addition of means so that when the communication apparatus is first turned on, the frequency counter portion of the apparatus for digitally displaying the display frequency and the memory portion for temporarily storing the display frequency in the digital frequency display device are simultaneously are not subject to transients in operation. In conventional apparatus, the display frequency being counting in the counter portion is incorrectly and/or unstably displayed.

SUMMARY OF THE INVENTION

Accordingly, an object of the present invention is to provide a digital frequency display device in which, during communicating operation, while a specified operating frequency is memorized, other frequency bands or frequencies may be searched or if the display of the original frequency is necessary, return to the original frequency is easily made.

Another object of the present invention is to provide a digital frequency display device in which the memorizing condition of the display frequency is indicated by erasing any one of digits of the numerals representing the display frequency, thus eliminating any additional component for the memorizing indication.

A further object of the present invention is to provide a digital frequency display device free from unstable and incorrect display arising from transient operations of the respective portions of the display device when the display device is first turned on. A digital frequency display device according to the present invention comprises a first means for storing a frequency to be displayed at a desired time, and a second means for indicating the fact that the display frequency is now memorized by the first means.

In another aspect of the present invention, there is provided a digital frequency display device comprising a first means for storing a frequency to be displayed at a desired time, a second means for indicating the fact that the display frequency is now memorized by the first means, and a third means for making the first means effective in operation after a predetermined time. Other objects and features of the present invention will be apparent from the following description taken in connection with the accompanying drawings, in which:

BRIEF DESCRIPTION OF THE DRAWINGS

In the drawings, like reference numerals are used to indicate like or equivalent components, sometimes with additional characters.

DETAILED DESCRIPTION OF THE PREFERRED EMBODIMENTS

Figure 1:
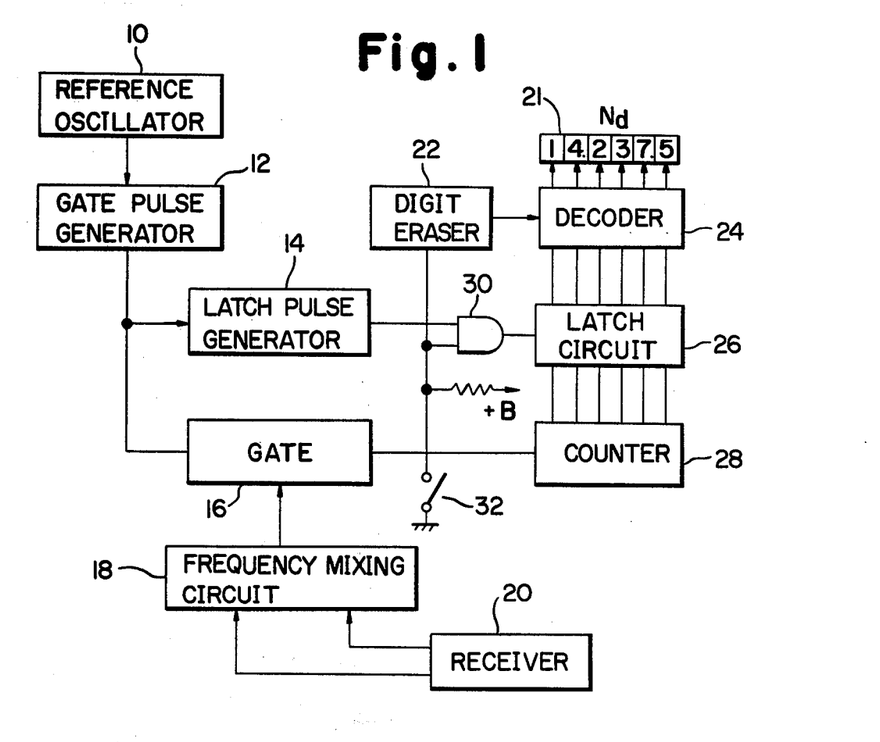
FIG. 1 shows a block diagram of an embodiment of a digital frequency display device according to the present invention.

Reference will be made to FIG. 1 schematically illustrating a digital frequency display device according to the present invention. In the figure, a reference frequency oscillator 10 is coupled with a gate pulse generator 12 which also coupled with a latch pulse generator 14 and a gate 16. The gate 16 is connected with the output of a receiving section 20 through a frequency mixing circuit 18. The receiving section 20 corresponds to the one of a communication apparatus such as a receiver or a transmitter. The latch pulse generator 14 is connected with a latch circuit 26 through an AND gate 30 whose input also is connected with a digit eraser 22 and a switch 32. The digit eraser 22 is connected at the output with a decoder 24 which in turn is coupled with the display section 21. The gate 16 is outputted to a frequency counter 28.

The frequency mixing circuit 18 is used for forming the display frequency by mixing the local oscillating frequencies from the receiving section such as, for example, BFO and VFO frequencies. The resultant frequency from the frequency mixing circuit 18 is applied to the frequency counter 28 through the gate 16. The frequency counter 28 includes a plurality of decimal counters (not shown) whose necessary number depends on the digits of the display frequency to be displayed. The coded output of the frequency counter 28 is applied through the latch circuit 26 to the decoder 24 where it in turn is decoded to drive the digital display section 21 also labeled Nd for frequency display. Generally, the latch pulse generator is directly coupled with the latch circuit 26; however, in this example, the AND gate 30 is used therebetween. The gate 30 as shown is enabled in response to the open condition of the switch 32 as shown. The latch circuit 26 transmits only the counting results of the frequency counter 28. More specifically the latch circuit 26 stores the counting results until the frequency counter 28 completes a given counting cycle. Then the stored data is transmitted to the display section 21 through the decoder 24 upon receipt of the latch pulse. The latch circuit 26 is also resetable for storing the ensuing counting results. Thus, if no latch pulse is applied to the latch circuit, the contents then being stored the latch circuit 26 will be displayed in the display section 21. The digit eraser 22 controls the decoder 24 to indicate the fact that the display device is in memorised condition. This will be described in detail later.

In operation, when the switch 32 is open, the AND gate 30 is enabled to permit the latch pulses from the latch pulse generator 14 to pass therethrough to the latch circuit 26, thus providing digital frequency display in the conventional way.

When the switch 32 is closed, the AND gate 30 is disabled and blocks transfer of the latch pulses to the latch circuit 26, with the result that the stored contents the latch circuit 26 remains unchanged and the display of the frequency in the display section 21 is fixed. In this situation, the digit eraser 22 may be driven to control the decoder 24 to erase the unnecessary digits of the numerals representing the display frequency. For example, as shown in FIG. 1, the frequency 14.237.5 (MHz) is displayed. Generally, the higher digits infrequenctly vary or are invariable, with little necessity of memorizing such digits. Accordingly, it is possible to erase one or two high digits of the displayed numerals for the display frequency to provide a memorizing indication and without reduction in the utility of the frequency display. Erasure of only a small number of digits also ensures rememberance necessary when the digit eraser is released to re-display the memorized frequency.

Figure 2:
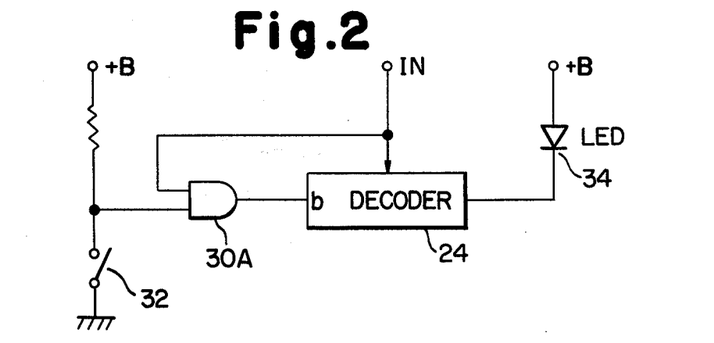
FIG. 2 shows a schematic circuit diagram of the digit erasing portion of the device of FIG. 1.

Referring now to FIG. 2, circuit is shown for erasing a digit of the displayed frequency. The switch 32 is connected through an AND gate 30A to an unblanking terminal *b* of the decoder 24 whose output is connected to a display element 34 also labeled LED. An incoming signal from the latch circuit 26 via a terminal IN is coupled with the input of the AND gate 30A and the decoder 24. The close of the switch 32 enables the AND gate 30A to drive the unblanking circuit via the terminal *b* so that the display element LED correspondingly related to the unblanking terminal *b* goes out. This circuit principle is applicable to the display elements corresponding to the digits necessarily to be erased in display.

Figure 3:
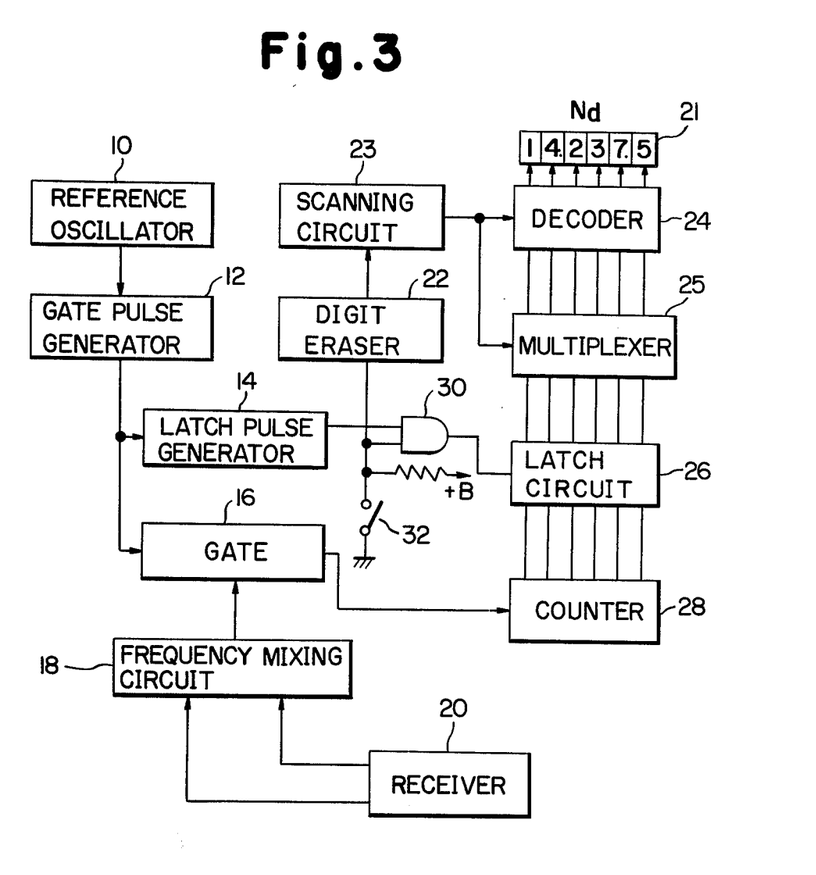
FIG. 3 is a block diagram of a digital frequency display device in which the present invention is applied to a dynamic drive system display device.

FIG. 3 shows in block form a circuit construction of a digital frequency display in which the present invention is applied to a dynamic drive type digital frequency display. This circuit uses a scanning drive circuit 23 for driving the respective digits and a multiplexer 25. The scanning circuit 23 is inserted between the digit eraser 22 and the decoder 24, and the demultiplexer 25 is connected between the latch circuit 26 and the decoder 24. The output of the scanning circuit 23 is also connected demultiplexer 25. The erasing of the digits desired to be erased may be effected by omitting the scanning of the corresponding digits through the control of the scanning circuit 23.

Figure 4:
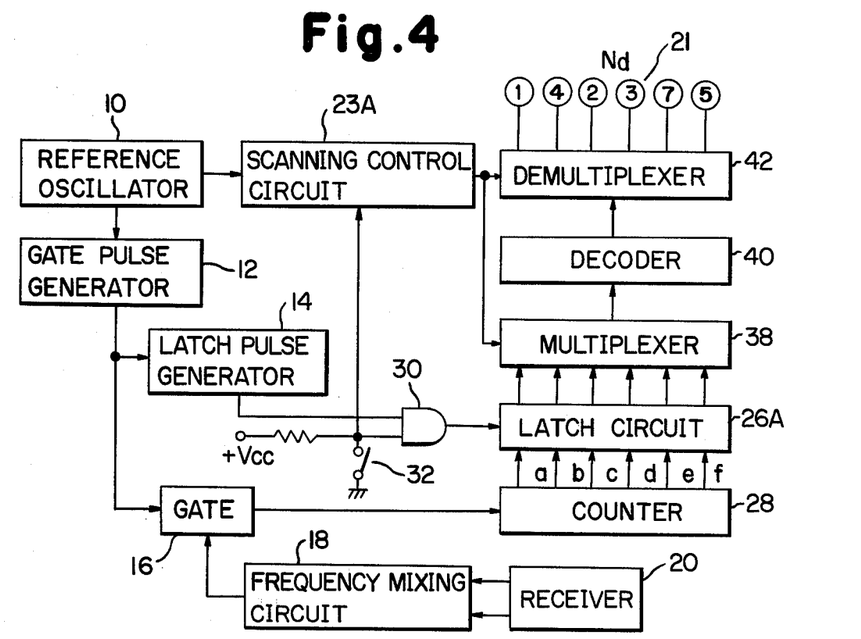
FIG. 4 is a block diagram of another embodiment of the digital frequency display device of the present invention.

Turning now to FIG. 4, another embodiment of the digital frequency display device according to the present invention is shown. The receiving section 20 is connected to the frequency mixing circuit 18 which in turn is connected to the gate 16. The gate pulse generator 12 is connected to the gate 16 and the latch pulse generator 14 which, in turn, is connected to the AND gate 30. Upon receipt of the gate pulse 12, the gate 16 is enabled to allow the resultant frequency from the frequency mixing circuit 18 to pass therethrough to the counter 28. The reference frequency oscillator 10 is coupled to the gate pulse generator 12 and a scanning control circuit 23A. The scanning control circuit 23A essential to this embodiment is responsive to the output of the oscillator 10 to cause the multiplexer 38 and the demultiplexer 40 to do scanning operations. When the switch 32 is closed, the indication of the memorized condition is provided by the display device. The multiplexer circuit 38 is used to successively and selectively extract one by one the digit outputs temporarily stored in the latch circuit 26A. The demultiplexer 42 successively and selectively demultiplexes the outputs of digital signals from the decoder 40 to apply them to the corresponding display elements of the display section 21. The gate 30 electrically disconnects the latch circuit 26A from the latch pulse generator 14, when the switch 32 is closed. The scanning control circuit 23A selectively interrupts the scanning operation of the multiplexer and demultiplexer 38 and 42 when the switch 32 is closed.

In operation, when the switch 32 is open, the latch pulses from the latch pulse generator 14 is fed to the latch circuit 26A, and the digital display operation is similar dynamic drive mode. More specifically, the display frequency via the counter gate 16 from the frequency mixing circuit 18 is fed to the frequency counter 28 where it is counted. In response to the latch pulses from the latch pulse generator 12, the digit outputs *a* to *f* from the counter 28 are temporarily stored in the latch circuit 26A. These stored digits outputs stored are successively and selectively extracted one by one from the latch circuit 26A through the multiplexer to be applied to the decoder 40 where they are decoded into the corresponding digital display signals. Those digital display signals are successively and selectively taken out of the decoder 40 to be fed to the corresponding display elements of the display section 21. With this arrangement the counted frequency is correctly displayed in the display section 21 and the displayed frequency will change to reflect changes in the counted frequency. That is, the counted frequency to be displayed is transmitted to the display section every time the latching pulse is fed to the latching circuit 26A.

When the switch 32 is closed, the AND gate 30 is disabled to disconnect the latch circuit 26A from the latch pulse generator 14. As a result, frequency values stored immediately before the switch 32 is closed are kept stored in the latch circuit 26A and the display displays fixedly such frequency values. It is further seen that, the closing of the switch 14 drives the sweep control circuit 23 which in turn controls the sweeping operations of the multiplexer 38 and the demultiplexer 42 to interrupt the display of at least one of the digit outputs of the latch circuit 26A. The result is that the display element is blanked, providing an indication that the digital frequency display device is now in the memorized condition.

Figure 5:
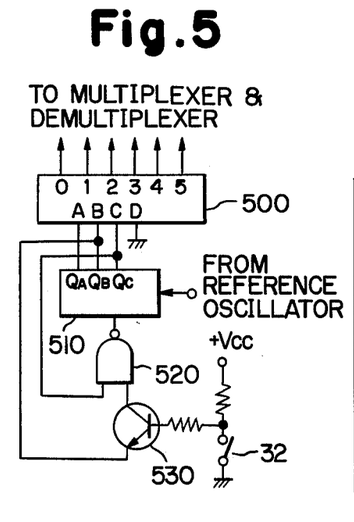
FIGS. 5 and 6 are schematic circuit diagrams of the scanning control circuit used in the device of FIG. 4 device.
Figure 6:
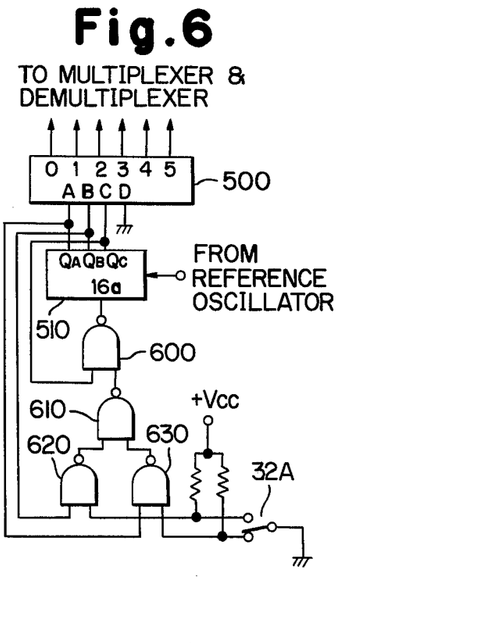

FIGS. 5 and 6 provide further details of the scanning control circuit 23A. In FIG. 5, a modulo-6 counter 510 clock pulse input of which is obtained by frequency-dividing the reference frequency from the reference oscillator 10. A switching transistor 530 is connected at the base with the switch 32 through a resistor, at the collector with one of inputs of a NAND gate 520, and at the emitter with the input terminal A of a BCD to decimal code decoder 500. The NAND gate 520 is coupled at another input with the output terminal Qc of the modulo-6 counter 510 and the input terminal C of the BCD to decimal code decoder 500, and at the output with the modulo-6 counter 510. The modulo-6 counter is connected with the BCD to decimal code decoder 500 through corresponding terminals. The switching state of the transistor 530 is controlled by the ON/OFF operation of the switch 32 as shown. The BCD to decimal code decoder converts the BCD code outputs of the modulo-6 counter 510 into the decimal code signal which is used as a scanning signal for the multiplexer 38 and the demultiplexer 42.

When the switch 32 is open, the BCD outputs of the modulo-6 counter 510 are code-converted in the BCD to decimal code decoder 500 into the decimal code signals which in turn appear at the output terminals 0 to 5 to be provide to the multiplexer 38 and the demultiplexer 42. Therefore, all of the display elements of six digits are lighted.

When the switch 32 is closed, the switching transistor 530 is turned off thereby forcing the modulo-6 counter 510 to operate as a modulo-4 counter. As a result, no output appears at the output terminals 4 and 5 of the BCD to decimal code decoder 510 so that the scanning operations of the multiplexer 38 and the demultiplexer 42 are partially interrupted and two of the six display elements are not lit up.

Another scanning control circuit is shown in FIG. 6 in which a combination of three NAND gates 610, 620, and 630 and a switch 32 A are used in place of the combination of the switching transistor 530 and the switch 32 in the circuit of FIG. 5. In this instance, when the moveable element of the switch 32A is connected to the lower side contact as shown, the counter 510 operates as the modulo-6 counter. However, when it is connected to the upper side contact, the counter 510 is reset to operate as the modulo-5 counter, and one display element cannot be lighted.

It will, of course, be understood that conventional shift-registers and Johnson counters could be used in the scanning control circuit 23A.

Figure 7:
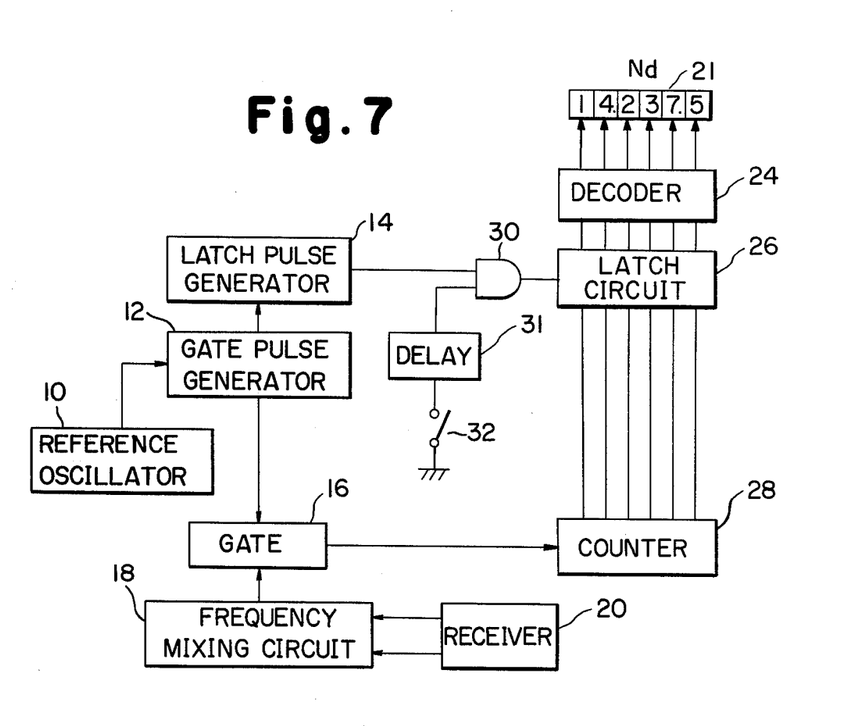
FIG. 7 is a block diagram of a further embodiment of the digital frequency display device according to the present invention.
Figure 8:
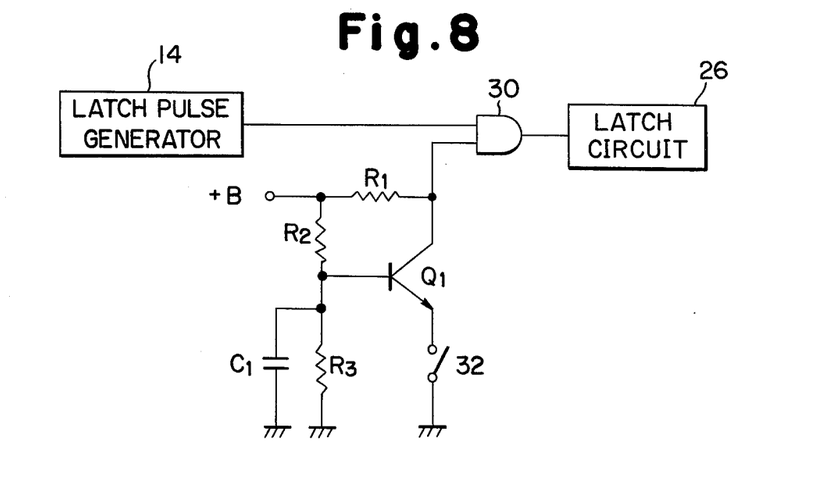
FIG. 8 is a schematic circuit diagram of the delay circuit of the display device of FIG. 7.

FIGS. 7 and 8 illustrate further features of the digital frequency display device according to the present invention such as the use of a delay circuit 31. Other circuit components are the same as those previously mentioned. As previously, the outputs of local oscillators (not shown) from the receiving portion 20 are mixed in the mixing circuit 18 to form the frequency to be displayed. The gate pulses from the gate pulse generator 12 derived from the reference frequency generator 10 enables the gate 16 to permit the frequency to be counted and displayed to pass therethrough to the frequency counter 28. The latch pulse generator 14 also connect to the gate pulse pulse generator 12 feeds latch pulses to the latch circuit 26 through the gate 30 which is controlled by the switch 32. The display frequency values from the counter 28 are temporarily stored in the latch circuit 26 and fed to the display section 21 through the decoder 24.

As in the previous cases, when the switch 32 is turned off, the AND gate 30 is enabled so that the latch pulses from the latch pulse generator 14 are applied to the latch circuit 26 and the frequency display operation occurs in a conventional manner. On the other hand, when the switch 32 is turned on, the gate 30 is disabled, thereby preventing the latch pulses from being applied to the latch circuit 26. As a result, the contents of the latch circuit 26 at the time of are memorized, and the displayed frequency is frozen (displayed fixedly).

The delay circuit 31 in FIG. 7 delays the turn-off signal from the switch 32 to the AND gate 30 when the power switch of the communication apparatus including the receiving portion 20 is turned while the switch 32 is already turned on. This avoids transient operation and causes the digital frequency display to be stable, thereby ensuring the correct frequency display.

FIG. 8 shows a schematic circuit diagram for the delay circuit 31 of FIG. 7. A power supply voltage +B is provided with value sufficient to enable the AND gate 30 through a resistor R1 when the switch 32 is turned off (open). A switching transistor Q1 is provided for executing the on-off control of the input of the AND gate 30, through cooperation with resistor R1 is a load resistor cooperating with the switching transistor Q1 to drop the collector voltage of the transistor Q1 to a satisfactory value when the transistor Q1 is turned on. Resistors R2 and R3 provide a bias voltage to the transistor Q1 when the switch 32 is turned on (closed). A capacitor C1, in cooperation with a resistor R3, provides a time constant circuit controlling the bias voltage to the transistor Q1. This arrangement prevents the transistor Q1 from turning on until after the power supply voltage, i.e. the +B voltage, has risen to a predetermined time delay. By such time the receiver operation will have become stable, thereby permitting the frequency to be counted and displayed correctly without transient disturbances.

In operation, when the switch 32 is open, the base-collector circuit of the transistor Q1 is inversely biased and the transistor Q1 is turned off. Accordingly, the +B voltage is applied to the control input of the AND gate 30 through the resistor R1 and the AND gate 30 is enabled when the latch pulse is applied to the other input of the AND gate 30, thereby permitting the latch pulse to pass therethrough to the latch circuit 26.

When the switch 32 is closed, the emitter-base circuit of the transistor Q1 is forwardly biased to turn-on the transistor, thereby effectively grounding one of inputs to the AND gate 30 so that the AND gate 30 is disabled to electrically disconnect the latch circuit 26 from the latch pulse generator 14.

When the power switch of the communication apparatus is first turned on, the +B voltage rises from zero over a predetermined time interval to final value +B. Meanwhile the capacitor C1 is charging to provide the bias voltage to the transistor Q1. Once the bias voltage across the capacitor C1 has reached a predetermined value, and if the switch 32 is then turned on, the transistor Q1 will be turned on instantaneously, permitting a correct frequency display operation.

When the power switch is first turned on, the initial value of the +B is 0. If the switch 32 is also turned on, the base voltage of the switching transistor Q1 will increase to a predetermined level after a time interval determined by the capacitor C1 and the resistor R3, and the transistor Q1 will then turn on.

Incidentally, the time constant set by the capacitor C1 and the resistor R3 is preferably established to be comparable to a several, such as three, counting cycles of the frequency counter.

Various other modifications of the disclosed embodiments will become apparent to persons skilled in the art without departing from the spirit and scope of the invention as defined by the appended claims.

What is claimed is:

1. A digital frequency display device comprising:
   first means for obtaining a count representative of a signal frequency to be displayed;
   second means operably connected to said frist means for storing a count provided by said first means and adapted to be placed in a memorizing condition;
   third means operably connected to said first and second means for displaying digits and adapted to display digits representative of a count; and fourth means operably connected to said second means for altering the display of digits provided by said third means when said second means is in the memorizing condition as compared to the display of digits which would be provided were said second means not in said memorizing condition to indicate that said second means is in the memorizing condition.

2. A digital frequency display device according to claim 1 wherein said fourth means causes said third means to erase a digit of the count representing the signal frequency displayed.

3. A digital frequency display device according to claim 1 wherein said fourth means causes said third means to erase at least one of the higher order digits of the count representing the signal frequency displayed.

4. A digital frequency display device according to claim 1, further comprising a fifth means operably connected to said fourth means for preventing said third means from operating in its normal manner until after a predetermined interval of time.

5. A digital frequency display device comprising:
counting means for counting a frequency to be displayed;
latching means for temporarily storing a plurality of digit signals representative of a count from said counting means and for outputting said digit signals in response to latch pulses and adapted to be placed in a memorizing condition;
decoding means for decoding said digit signals from said latching means to another code system;
display means for visually displaying the digit signals decoded by said decoding means;
gate means for preventing latch pulses from reaching said latching means; and
digit erasing means for erasing a digit which would otherwise be displayed by said display means, said erasing to occur when said latching means is in the memorizing condition and when latch pulses feeding to said latching means are blocked by said gate means to indicate said latching means is in the memorizing condition.

6. A digital frequency display device according to claim 5 wherein said gate means is an AND gate having its output operably connected to said latching means, a first input operably coupled to a pulse generator for generating latch pulses and a second input operably coupled to said digit erasing means and wherein a switch means controls the gating operation of said AND gate.

7. A digital frequency display device according to claim 6 wherein said digit erasing means includes a second gate means and an unblanking means, said second gate means driving said unblanking means, said unblanking means being adapted to erase any one of the displayed digits.

8. A digital frequency display device according to claim 5 further comprising a scanning control means and a multiplexing means for demultiplexing the digit signals from said latching means and for outputting digit signals to said decoding means, said scanning control means being responsive to said digit erasing means and controlling the scanning operation of said decoding means and said multiplexing means.

9. A digital frequency display device comprising:
counting means for counting a frequency to be displayed;
latching means for temporarily storing a plurality of digit signals representative of the count in said counting means and for outputting said digit signals in response to latch pulses;
multiplexing means for successively and selectively extracting, one by one, said digit signals from said latching means;
decoding means for converting the digit signals from said multiplexing means into digital display signals;
demultiplexing means for successively and selectively taking out the digital display signals from said decoding means;
display means for visually displaying the digital display signals decoded from said demultiplexing means;
means for storing digital signals representative of the display frequency, said storing means being adapted to be placed in a memorizing condition; and
means for changing the scanning operation of said multiplexing and demultiplexing means when said storing means is in the memorizing condition to provide a visual indication that the storing means is in the memorizing condition.

10. A digital frequency display device according to claim 9 wherein said storing means includes gate means having its output connected to said latching means, a first input connected to a pulse generator for generating latch pulses, and a second input connected to said scanning operation changing means and wherein a switch means controls the gating operation of said gate means.

11. A digital frequency display device according to claim 9 wherein said scanning operation means includes scanning signal forming means for said multiplexing and demultiplexing means, counting means of variable modulo controllably connected with said scanning signal forming means and switching means for changing the modulo of said counting means.

* * * * *

UNITED STATES PATENT AND TRADEMARK OFFICE
CERTIFICATE OF CORRECTION

PATENT NO. : 4,103,290

DATED : July 25, 1978

INVENTOR(S) : TADAO SEKIGUCHI

It is certified that error appears in the above-identified patent and that said Letters Patent are hereby corrected as shown below:

Column 1, lines 15 and 19, change "memorised" to --memorized--;
    line 25, change "subject" to --subjected--;
    line 27, change "counting" to --counted--.

Column 2, line 10, after "Fig. 4" insert a semicolon (;);
    line 11, delete in its entirety.

Column 3, line 1, change "memorised" to --memorized--;
    line 17, change "infrequenctly" to --infrequently--;
    line 24, before "necessary" insert --as--.

Column 4, line 23, change "digits" to --digit--; same line delete "stored" (second occurrence);
    line 41, after "display" insert --section--.

Column 5, line 8, change "demultim-" to --demulti- --;
    line 29, after "cannot" insert --then--;
    line 46, delete "pulse" (second occurrence);
    line 60, after "of" insert --switching--.

Column 6, line 18, after "termined" insert --level after a predetermined --;
    line 53, delete "a" ; same line, before "counting" insert --the--;

UNITED STATES PATENT AND TRADEMARK OFFICE
CERTIFICATE OF CORRECTION

PATENT NO. : 4,103,290

DATED : July 25, 1978

INVENTOR(S) : TADAO SEKIGUCHI

It is certified that error appears in the above-identified patent and that said Letters Patent are hereby corrected as shown below:

Column 6 line 63, change "frist" to --first--.

Signed and Sealed this

Fifth Day of June 1979

[SEAL]

Attest:

RUTH C. MASON
Attesting Officer

DONALD W. BANNER
Commissioner of Patents and Trademarks